US012635192B2

(12) United States Patent
Hanasato et al.

(10) Patent No.: US 12,635,192 B2
(45) Date of Patent: May 19, 2026

(54) SWITCHING ELEMENT

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Mariko Hanasato, Nisshin (JP); Ryota Suzuki, Nisshin (JP)

(73) Assignees: DENSO CORPORATION, Kariya (JP); DENSO JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 397 days.

(21) Appl. No.: 18/505,246

(22) Filed: Nov. 9, 2023

(65) Prior Publication Data

US 2024/0186371 A1 Jun. 6, 2024

(30) Foreign Application Priority Data

Dec. 1, 2022 (JP) ................................. 2022-193072

(51) Int. Cl.
*H10D 62/10* (2025.01)
*H10D 30/66* (2025.01)
*H10D 62/17* (2025.01)

(52) U.S. Cl.
CPC ......... *H10D 62/111* (2025.01); *H10D 30/668* (2025.01); *H10D 62/393* (2025.01)

(58) Field of Classification Search
CPC ... H10D 62/111; H10D 62/393; H10D 30/668
See application file for complete search history.

(56) References Cited

U.S. PATENT DOCUMENTS

2015/0349113 A1* 12/2015 Katoh .................. H10D 30/668
257/331
2018/0175140 A1* 6/2018 Murakami ......... H10D 30/0297

FOREIGN PATENT DOCUMENTS

JP 2022-083790 A 6/2022

* cited by examiner

*Primary Examiner* — Douglas M Menz
(74) *Attorney, Agent, or Firm* — Posz Law Group, PLC

(57) ABSTRACT

A switching element includes a semiconductor substrate having inter-trench semiconductor layers each interposed between trenches and including a body region. The semiconductor substrate further includes deep regions and connection regions that connect the deep regions and the body region. The connection regions are arranged in rows. Intersection portions of the inter-trench semiconductor layers and the rows include connection intersection portions at which the connection regions are disposed and non-connection intersection portions at which the connection regions are not disposed. The connection intersection portions and the non-connection intersection portions are repeatedly arranged according to a reference pattern in which a number of the non-connection intersection portions interposed between adjacent two of the connection intersection portions is three or four, and a Manhattan distance of each of the non-connection intersection portions to closest one of the connection intersection portions is 1.

4 Claims, 19 Drawing Sheets

SWITCHING ELEMENT

CROSS REFERENCE TO RELATED APPLICATION

The present application claims the benefit of priority from Japanese Patent Application No. 2022-193072 filed on Dec. 1, 2022. The entire disclosure of the above application is incorporated herein by reference.

TECHNICAL FIELD

The present disclosure relates to a switching element.

BACKGROUND

Conventionally, there has been known a trench-gate type switching element in which a plurality of p-type deep layers is disposed inside an n-type drift layer.

SUMMARY

The present disclosure provides a switching element that includes a semiconductor substrate having inter-trench semiconductor layers. Each of the inter-trench semiconductor layers is interposed between trenches and including a body region. The semiconductor substrate further includes deep regions and connection regions connecting the deep regions and the body region. The connection regions are arranged in rows. Intersection portions of the inter-trench semiconductor layers and the rows include connection intersection portions at which the connection regions are disposed and non-connection intersection portions at which the connection regions are not disposed. The connection intersection portions and the non-connection intersection portions are repeatedly arranged according to a reference pattern in which a number of the non-connection intersection portions interposed between adjacent two of the connection intersection portions is three or four, and a Manhattan distance of each of the non-connection intersection portions to closest one of the connection intersection portions is 1.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
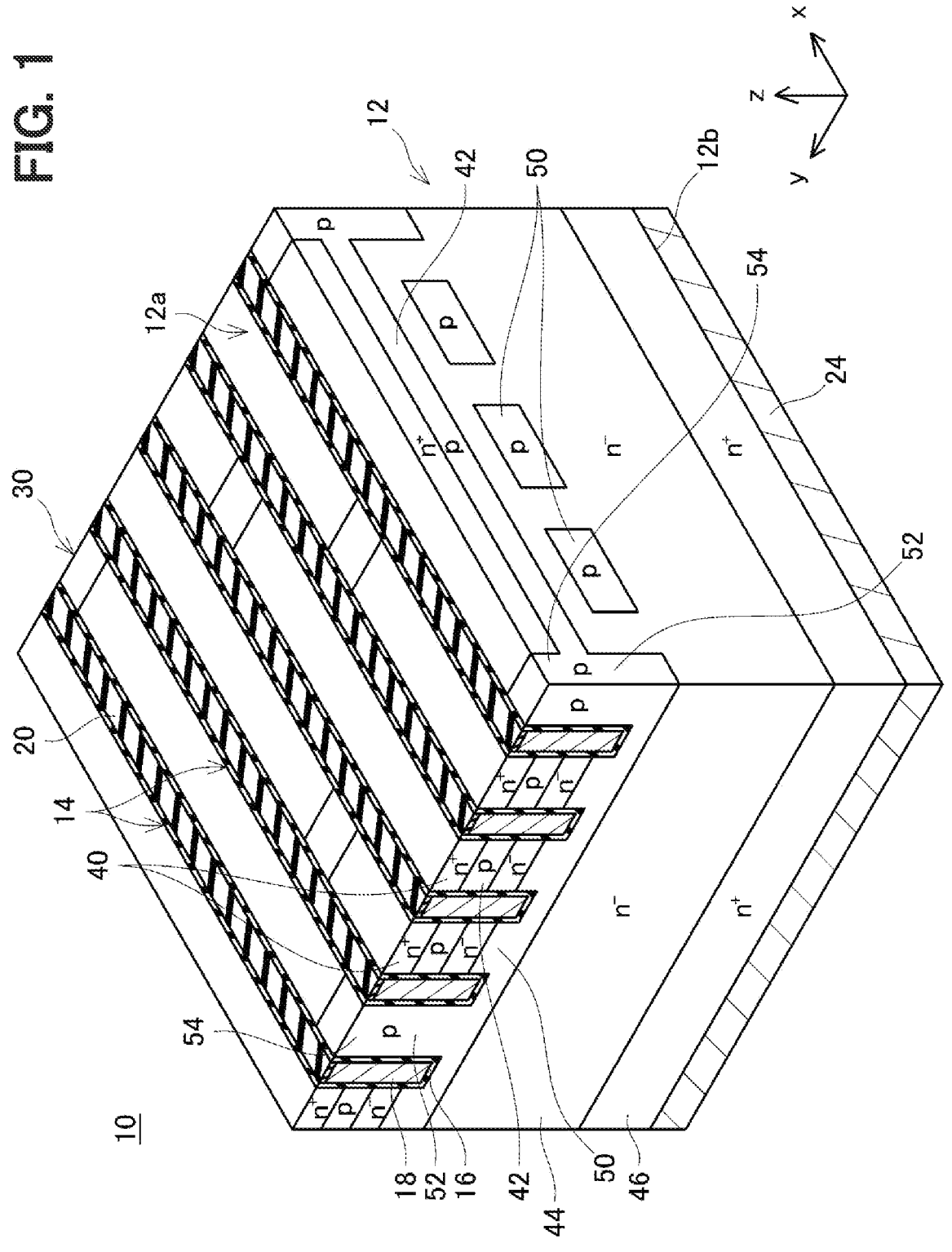
FIG. 1 is a perspective view including cross sections along an x direction and a y direction of a switching element according to a first embodiment.

Next, a relevant technology is described only for understanding the following embodiments. A trench-gate type switching element according to the relevant technology includes a plurality of deep layers of p-type disposed in a drift layer of n-type. Each of the deep layers is disposed below lower ends of trenches in a thickness direction of a semiconductor substrate. Note that each of the deep layers may be disposed in a range including the lower ends of the trenches in the thickness direction of the semiconductor substrate. The switching element further includes a plurality of connection regions of p-type. Each of the connection regions connects each of the deep layers to a body layer of p-type. When the deep layers and the connection regions are disposed in the above-described manner, an electric field applied to gate insulating films covering the lower ends of the trenches can be restricted.

In the above-described switching element, when the semiconductor substrate is viewed from above, the connection regions are arranged in a distributed manner so as to be kept at predetermined intervals in an x direction and a y direction. That is, when the semiconductor substrate is viewed from above, the connection regions are arranged in a distributed manner such that a density of the connection regions is low.

Inside the switching element, a diode (so-called body diode) is configured by an interface between the body layer of p-type and the drift layer of n-type. When a voltage applied to the body diode is switched from a forward direction to a reverse direction, a recovery current flows through the switching element, and a recovery surge occurs. When the density of the connection regions is low, the recovery surge can be restricted.

During the operation of the switching element, a recovery current or an avalanche current may flow from the drift region to each of the connection regions. In the above-described switching element, when the recovery current or the avalanche current flows in the drift region, the current is likely to concentrate in the vicinity of each of the connection regions.

A switching element according to an aspect of the present disclosure includes a semiconductor substrate, a gate insulating film, a gate electrode, and a source electrode. The semiconductor substrate has a plurality of trenches provided from an upper surface of the semiconductor substrate. Each of the plurality of trenches extends linearly in a first direction on the upper surface of the semiconductor substrate. The plurality of trenches is arranged at an interval in a second direction that intersects the first direction on the upper surface of the semiconductor substrate. The gate insulating film covers an inner surface of each of the plurality of trenches. The gate electrode is disposed inside each of the plurality of trenches and is insulated from the semiconductor substrate by the gate insulating film. The source electrode is in contact with the upper surface of the semiconductor substrate. The semiconductor substrate includes a plurality of inter-trench semiconductor layers, and each of inter-trench semiconductor layers is interposed between adjacent two of the plurality of trenches. Each of the plurality of inter-trench semiconductor layers includes a source region of n-type being in contact with the gate insulating film and the source electrode, and a body region of p-type being in contact with the gate insulating film at a position below the source region. The semiconductor substrate further includes a drift region of n-type, a plurality of deep regions of p-type, and a plurality of connection regions of p-type. The drift region is disposed over a lower portion of the plurality of inter-trench semiconductor layers and is in contact with the gate insulating film at a position below the body region in each of the plurality of inter-trench semiconductor layers. The plurality of deep regions is disposed in a range surrounded by the drift region, disposed below the body region at an interval from the body region, and disposed in a range including a lower end of each of the plurality of trenches or below the lower end of each of the plurality of trenches in a thickness direction of the semiconductor substrate. The plurality of connection regions connects the body region and the plurality of deep regions. When the semiconductor substrate is viewed from above, the plurality of connection regions is arranged at an interval along the second direction to form a plurality of rows that extends linearly in the second direction, and the plurality of rows is arranged at an interval in the first direction. When the semiconductor substrate is viewed from above, the plurality of inter-trench semiconductor layers intersects the plurality of rows at a plurality of intersection portions, and the plurality of intersection portions includes a plurality of connection intersection portions at which the plurality of connection regions is disposed and a plurality of non-connection intersection portions at which the plurality of connection regions is not disposed. Connection intersection portions included in the plurality of connection intersection portions and non-connection intersection portions included in the plurality of non-connection intersection portions are repeatedly arranged in the first direction and the second direction according to a reference pattern. Within a range in which the connection intersection portions and the non-connection intersection portions are repeatedly arranged according to the reference pattern, the connection intersection portions and the non-connection intersection portions satisfy following conditions (i) to (iv): (i) in each of the plurality of inter-trench semiconductor layers, the connection intersection portions are arranged in the first direction in a state where a number of the non-connection intersection portions interposed between adjacent two of the connection intersection portions is a reference number; (ii) in each of the plurality of rows, the connection intersection portions are arranged in the second direction in a state where a number of the non-connection intersection portions interposed between adjacent two of the connection intersection portions is the reference number; (iii) the reference number is three or four; and (iv) a Manhattan distance is a value counted with a unit of each of the intersection portions, and the Manhattan distance of each of the non-connection intersection portions to closest one of the connection intersection portions is 1.

In the switching element according to the above aspect, if there is a non-connection intersection portion having an extremely long distance to the closest connection intersection portion, the recovery current and the avalanche current hardly flow in the vicinity of the non-connection intersection portion having the extremely long distance to the closest connection intersection portion. In this case, the density of the recovery current and the avalanche current increases in the vicinity of the connection region. On the other hand, in the switching element according to the above aspect, the Manhattan distance from each of the non-connection intersection portions to the closest one of the connection intersection portions is 1 within a range in which the connection intersection portions and the non-connection intersection portions are repeatedly arranged according to the reference pattern. That is, there is no non-connection intersection having an extremely long distance to the closest connection intersection portion. Therefore, in this switching element, a current concentration in the vicinity of each of the connection regions can be restricted.

In the switching element according to the above aspect, the plurality of deep regions may extend linearly along the second direction and may be arranged at an interval in the first direction so that the plurality of deep regions extend along the plurality of rows, respectively, when the semiconductor substrate is viewed from above.

In the switching element according to the above aspect, each of the plurality of connection regions may be in contact with the gate insulating film on side surfaces of two trenches that are included in the plurality of trenches and are located on both sides of each of the plurality of connection regions.

In this configuration, an inversion layer formed in the body layer does not function as a channel at the connection intersection portions in which the connection regions are disposed. In the switching element described above, since the connection regions can be arranged in a distributed manner, the connection intersection portions that do not function as channels can be arranged in a distributed manner. Therefore, a main current that flows when the switching element is turned on can be distributed in the semiconductor substrate.

The switching element according to the above aspect may further include a contact region of p-type disposed above each of the connection regions and connecting the body region and the source electrode.

First Embodiment

A switching element 10 according to a first embodiment of the present disclosure includes a semiconductor substrate 12 as illustrated in FIG. 1. The semiconductor substrate 12 is made of silicon carbide (SiC). However, the semiconductor substrate 12 may be formed of another semiconductor such as silicon (Si) or gallium nitride (GaN). In the following, a direction parallel to an upper surface 12a of the semiconductor substrate 12 is referred to as an x direction, a direction parallel to the upper surface 12a and perpendicular to the x direction is referred to as a y direction, and a thickness direction of the semiconductor substrate 12 is referred to as a z direction. A plurality of trenches 14 is provided from the upper surface 12a of the semiconductor substrate 12. Each of the trenches 14 extends linearly in the x direction on the upper surface 12a. The trenches 14 are arranged at intervals in the y direction on the upper surface 12a. An inner surface of each of the trenches 14 is covered with a gate insulating film 16. A gate electrode 18 is disposed in each of the trenches 14. The gate electrode 18 is insulated from the semiconductor substrate 12 by the gate insulation film 16. An interlayer insulating film 20 is disposed in each of the trenches 14. The interlayer insulating film 20 covers an upper surface of the gate electrode 18.

As illustrated in FIGS. 2 to 5, a source electrode 22 is disposed above the semiconductor substrate 12. In FIG. 1, illustration of the source electrode 22 is omitted. The source electrode 22 covers upper surfaces of the interlayer insulating films 20 and the upper surface 12a of the semiconductor substrate 12. The source electrode 22 is insulated from the gate electrodes 18 by the interlayer insulating films 20. A drain electrode 24 is disposed below the semiconductor substrate 12. The drain electrode 24 covers a lower surface 12b of the semiconductor substrate 12.

Figure 6:
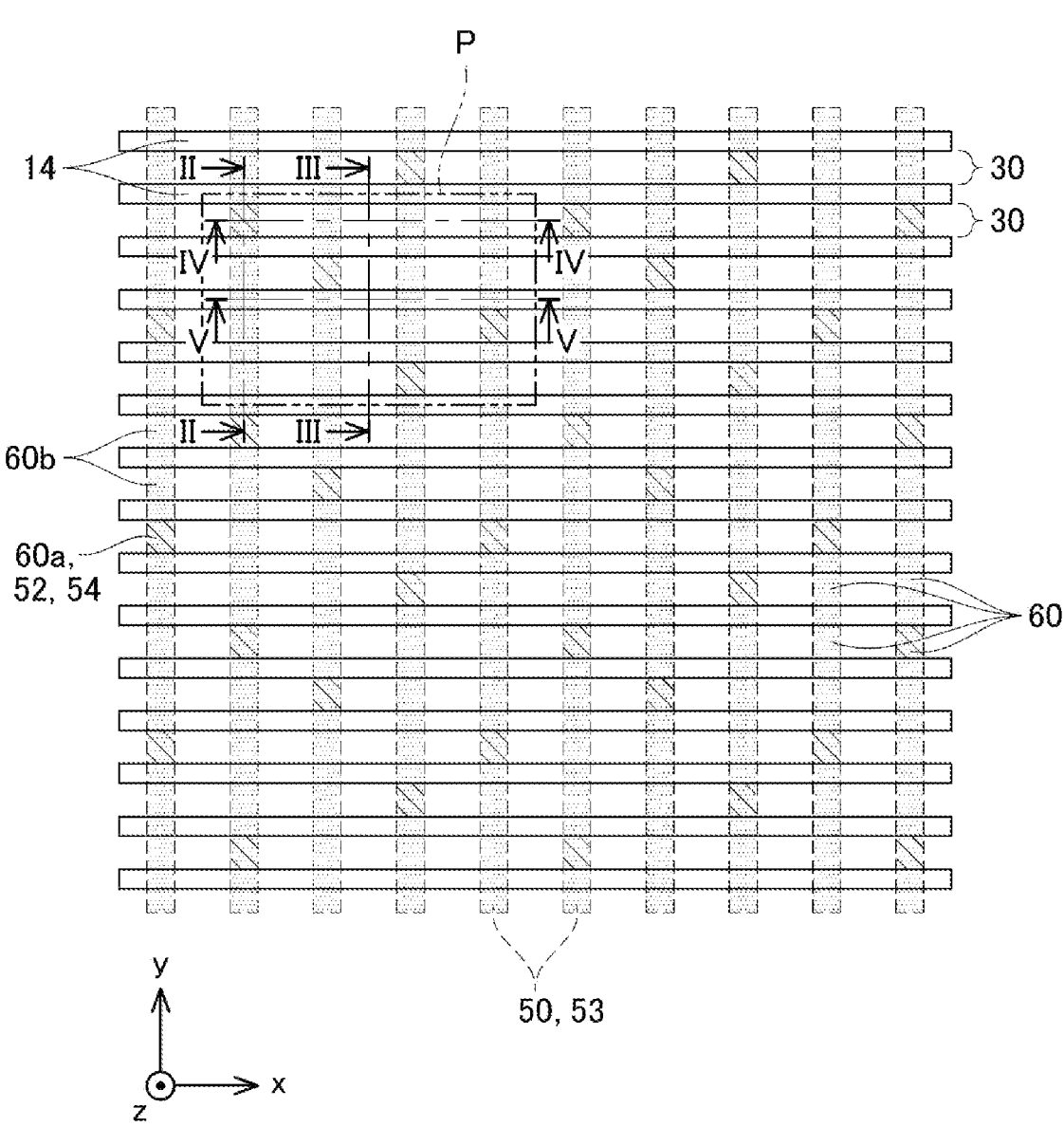
FIG. 6 is a plan view illustrating an arrangement of connection intersection portions and non-connection intersection portions of the switching element according to the first embodiment.

FIG. 6 illustrates the upper surface 12a of the semiconductor substrate 12. As described above, the trenches 14 extending linearly in the x direction are arranged at intervals in the y direction on the upper surface 12a. An inter-trench semiconductor layer 30 illustrated in FIG. 6 is a semiconductor layer interposed between the two adjacent trenches 14. Each of the inter-trench semiconductor layers 30 extends linearly in the x direction on the upper surface 12a. The inter-trench semiconductor layers 30 are arranged at intervals in the y direction on the upper surface 12a.

As illustrated in FIG. 1, the semiconductor substrate 12 includes a source region 40, a body region 42, a drift region 44, and a drain region 46.

Figure 2:
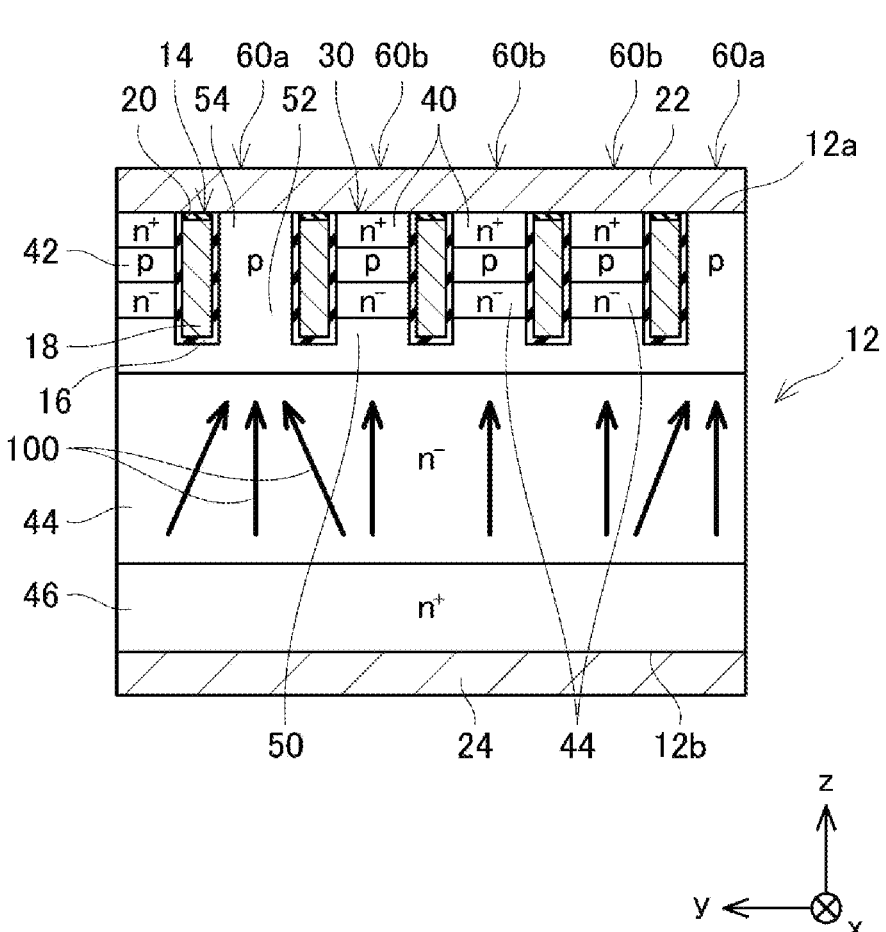
FIG. 2 is a cross-sectional view illustrating a cross section along the x direction at a position including a deep region, which corresponds to a position of line Il-Il in FIG. 6, of the switching element according to the first embodiment.
Figure 3:
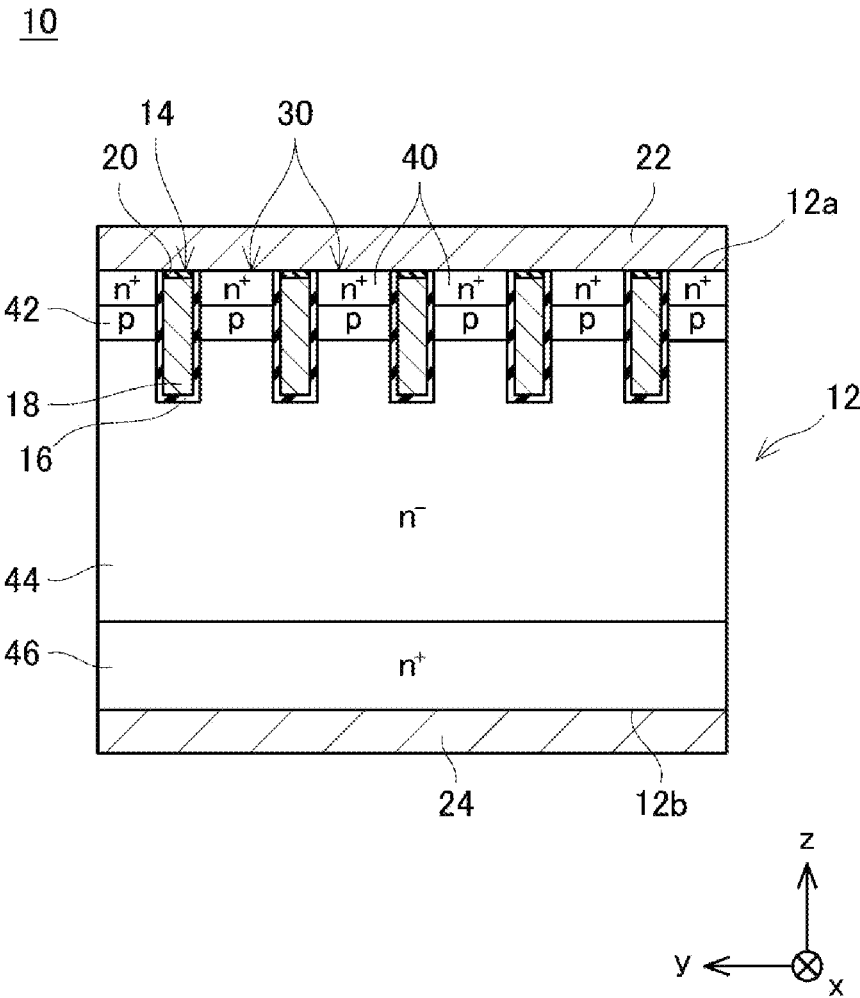
FIG. 3 is a cross-sectional view illustrating a cross section along the x direction at a position not including the deep region, which corresponds to a position of line Ill-Ill in FIG. 6, of the switching element according to the first embodiment.

The source region 40 is an n-type region having a high n-type impurity concentration. The source region 40 is disposed in the inter-trench semiconductor layer 30. As illustrated in FIG. 2 and FIG. 3, the source region 40 is in contact with the source electrode 22 in the inter-trench semiconductor layer 30. The source region 40 is in contact with the gate insulating films 16 on side surfaces of the trenches 14 located on both sides of the inter-trench semiconductor layer 30.

The body region 42 is a p-type region having a low p-type impurity concentration. The body region 42 is disposed in the inter-trench semiconductor layer 30. As illustrated in FIG. 2 and FIG. 3, the body region 42 is disposed in the inter-trench semiconductor layer 30 and is disposed below the source region 40. The body region 42 is in contact with the gate insulating films 16 at positions below the source region 40. That is, the body region 42 is in contact with the gate insulating films 16 on the side surfaces of the two trenches 14 located on both sides of the inter-trench semiconductor layer 30.

The drift region 44 is an n-type region having a low n-type impurity concentration. As illustrated in FIG. 2 and FIG. 3, the drift region 44 is disposed over lower portions of the plurality of inter-trench semiconductor layers 30. As illustrated in FIG. 3, an upper end portion of the drift region 44 extends into each of the inter-trench semiconductor layers 30. The drift region 44 is in contact with the body region 42 from below in each of the inter-trench semiconductor layers 30. The drift region 44 is in contact with the gate insulating films 16 at positions below the body region 42. That is, the drift region 44 is in contact with the gate insulating films 16 on the side surfaces of the trenches 14 located on both sides of each of the inter-trench semiconductor layers 30.

The drain region 46 is an n-type region having a high n-type impurity concentration. The n-type impurity concentration of the drain region 46 is higher than the n-type impurity concentration of the drift region 44. As illustrated in FIGS. 2 to 5, the drain region 46 is in contact with the drift region 44 from below. The drain region 46 is in contact with the drain electrode 24 on the lower surface 12b of the semiconductor substrate 12.

Figure 4:
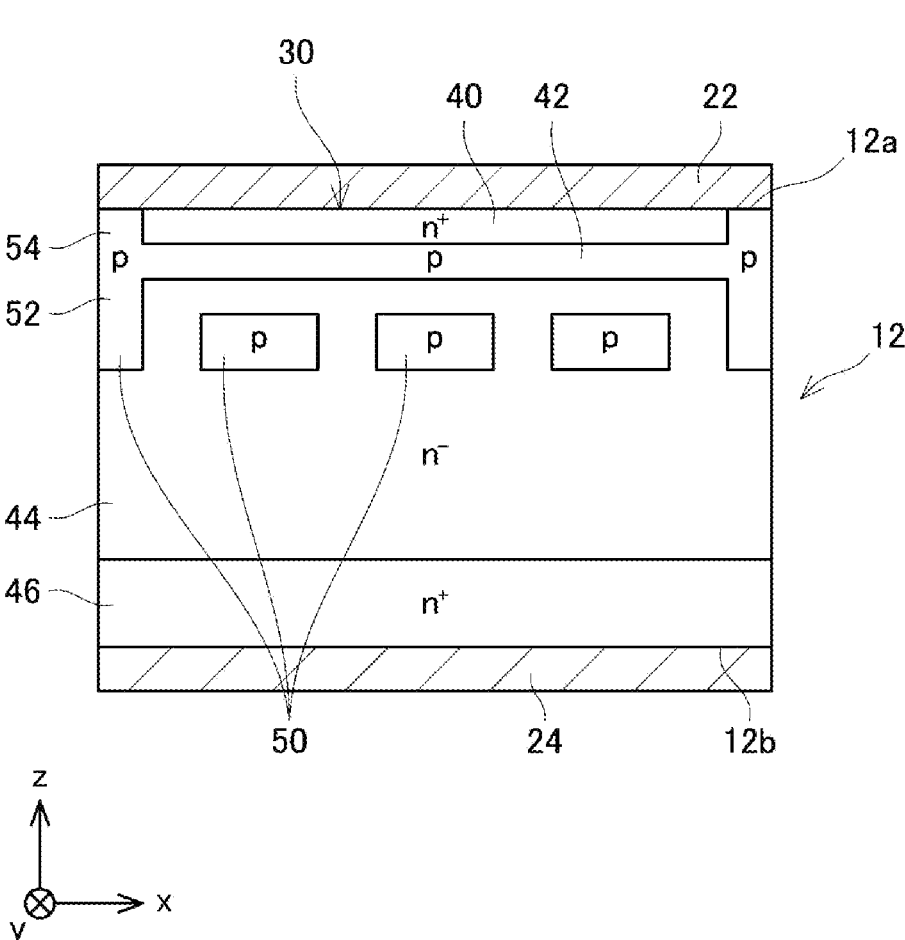
FIG. 4 is a cross-sectional view illustrating a cross section along the y direction at a position not including trenches, which corresponds to a position of line IV-IV in FIG. 6, of the switching element according to the first embodiment.
Figure 5:
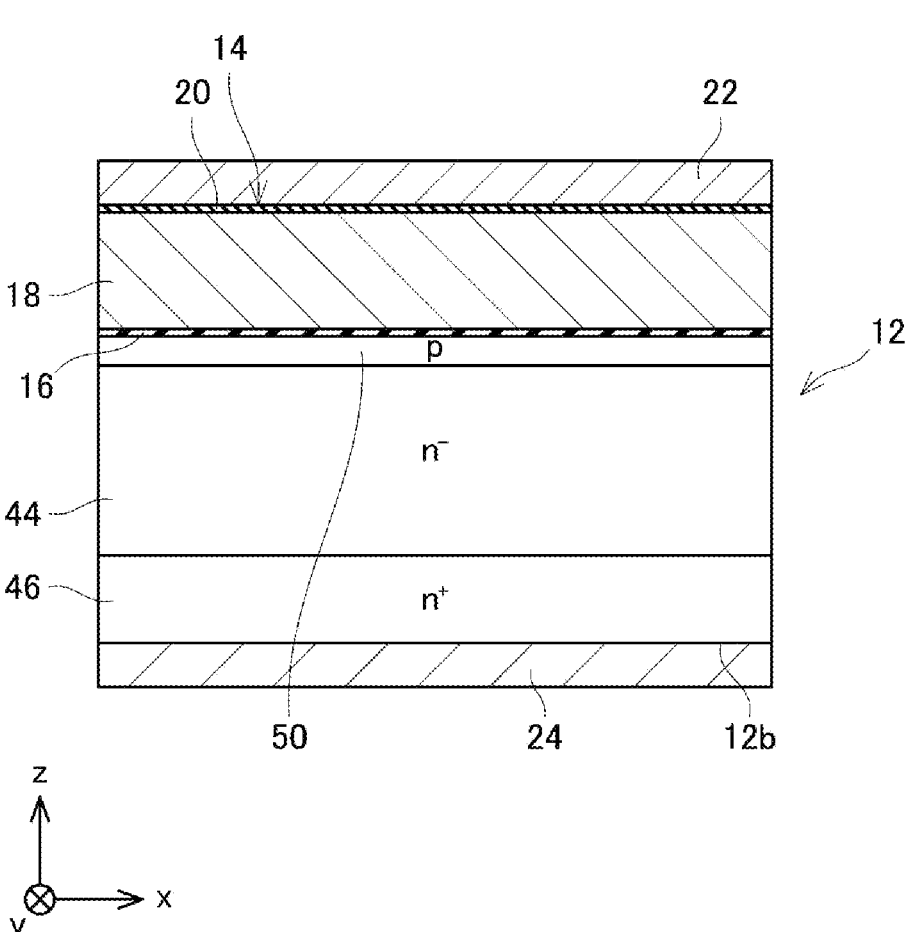
FIG. 5 is a cross-sectional view illustrating a cross section along the y direction at a position including trenches, which corresponds to a position of line V-V in FIG. 6, of the switching element according to the first embodiment.

The semiconductor substrate 12 has a plurality of deep regions 50 of p-type. As illustrated in FIG. 2 and FIG. 4, each of the deep regions 50 is disposed in a range surrounded by the drift region 44. Each of the deep regions 50 is disposed below the body region 42 at an interval from the body region 42. The drift region 44 is disposed in a region located between each of the deep regions 50 and the body region 42. In FIG. 6, dot-hatched regions indicate a distribution range of the deep regions 50. As illustrated in FIG. 6, when the semiconductor substrate 12 is viewed from above, each of the deep regions 50 extends linearly in the y direction. When the semiconductor substrate 12 is viewed from above, the deep regions 50 are arranged at intervals in the x direction. As illustrated in FIG. 1, FIG. 2, and FIG. 5, each of the deep regions 50 is arranged in a range including lower ends of the trenches 14 in the z direction. Therefore, each of the deep regions 50 is in contact with the gate insulating films 16 at the lower ends of the trenches 14.

As illustrated in FIG. 1, the semiconductor substrate 12 includes a plurality of connection regions 52 and a plurality of contact regions 54. As illustrated in FIG. 1, FIG. 2, and FIG. 4, the connection regions 52 are p-type regions that connect the body region 42 and the deep regions 50. The contact regions 54 are p-type regions that connect the body region 42 and the source electrode 22. That is, the contact regions 54 extend upward from the body region 42 and are in contact with the source electrode 22 at upper ends thereof. In the present embodiment, the contact regions 54 and the connection regions 52 continuously extend in the z direction. That is, each of the contact regions 54 is disposed above corresponding one of the connection regions 52. The semiconductor substrate 12 includes a plurality of sets of the contact region 54 and the deep region 50. Each of the deep regions 50 is connected to the source electrode 22 via the connection regions 52 and the contact regions 54.

Hatched regions in FIG. 6 indicate sets of the connection region 52 and the contact region 54. The sets of the connection region 52 and the contact region 54 are partially provided above the deep regions 50. As illustrated in FIG. 6, when the semiconductor substrate 12 is viewed from above, the connection regions 52 are arranged to form a plurality of rows 53 extending linearly in the y direction. In FIG. 6, the rows 53 extending in the y direction overlap the deep regions 50. The rows 53 are arranged at intervals in the x direction.

Intersection portions 60 illustrated in FIG. 6 are portions where the inter-trench semiconductor layers 30 and the rows 53 intersect when the semiconductor substrate 12 is viewed from above. As described above, each of the inter-trench semiconductor layers 30 extends linearly in the x direction, and each of the rows 53 extends linearly in the y direction. Therefore, when the semiconductor substrate 12 is viewed from above, the intersection portions 60 are arranged in a matrix along the x direction and the y direction. As illustrated in FIG. 6, the sets of the connection region 52 and the contact region 54 are provided in a part of the intersection portions 60. As illustrated in FIG. 1, FIG. 2, and FIG. 6, each of the connection regions 52 is in contact with the gate insulating films 16 on the side surfaces of the trenches 14 located on both sides of the intersection portions 60. In addition, each of the contact regions 54 is in contact with the gate insulating films 16 on the side surfaces of the trenches 14 located on both sides of the intersection portions 60. Hereinafter, the intersection portions 60 in which the connection regions 52 are disposed are referred to as connection intersection portions 60a, and the intersection portions 60 in which the connection regions 52 are not disposed are referred to as non-connection intersection portions 60b.

Figure 7:
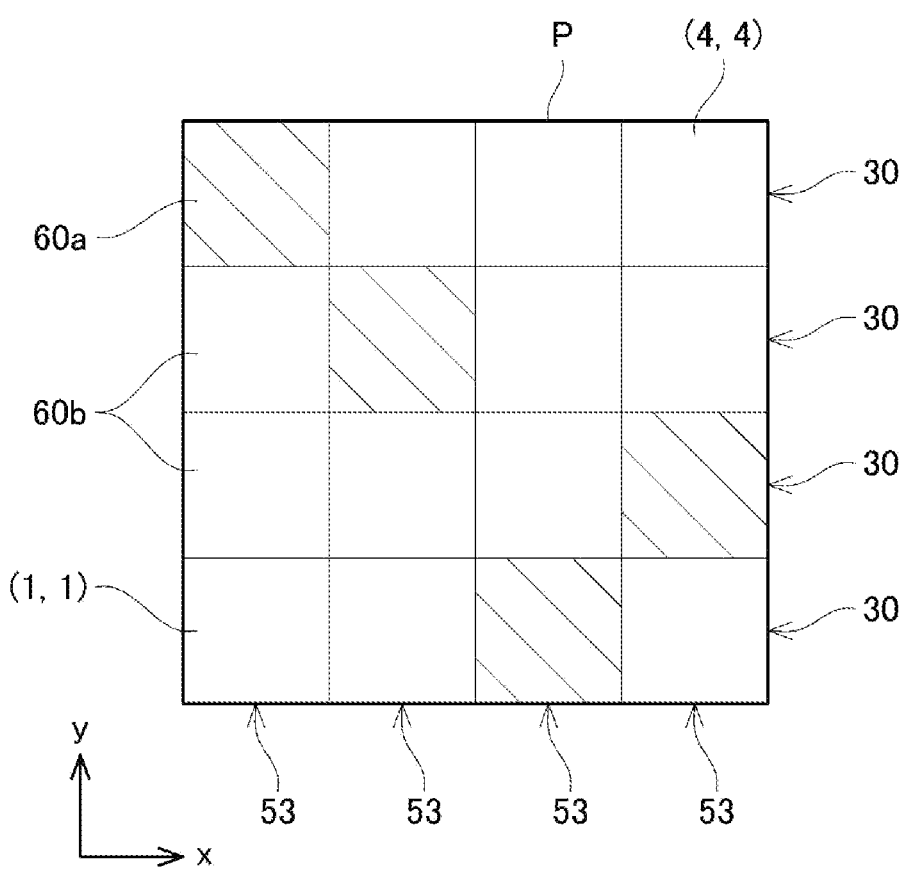
FIG. 7 is a diagram illustrating a reference pattern P.
Figure 8:
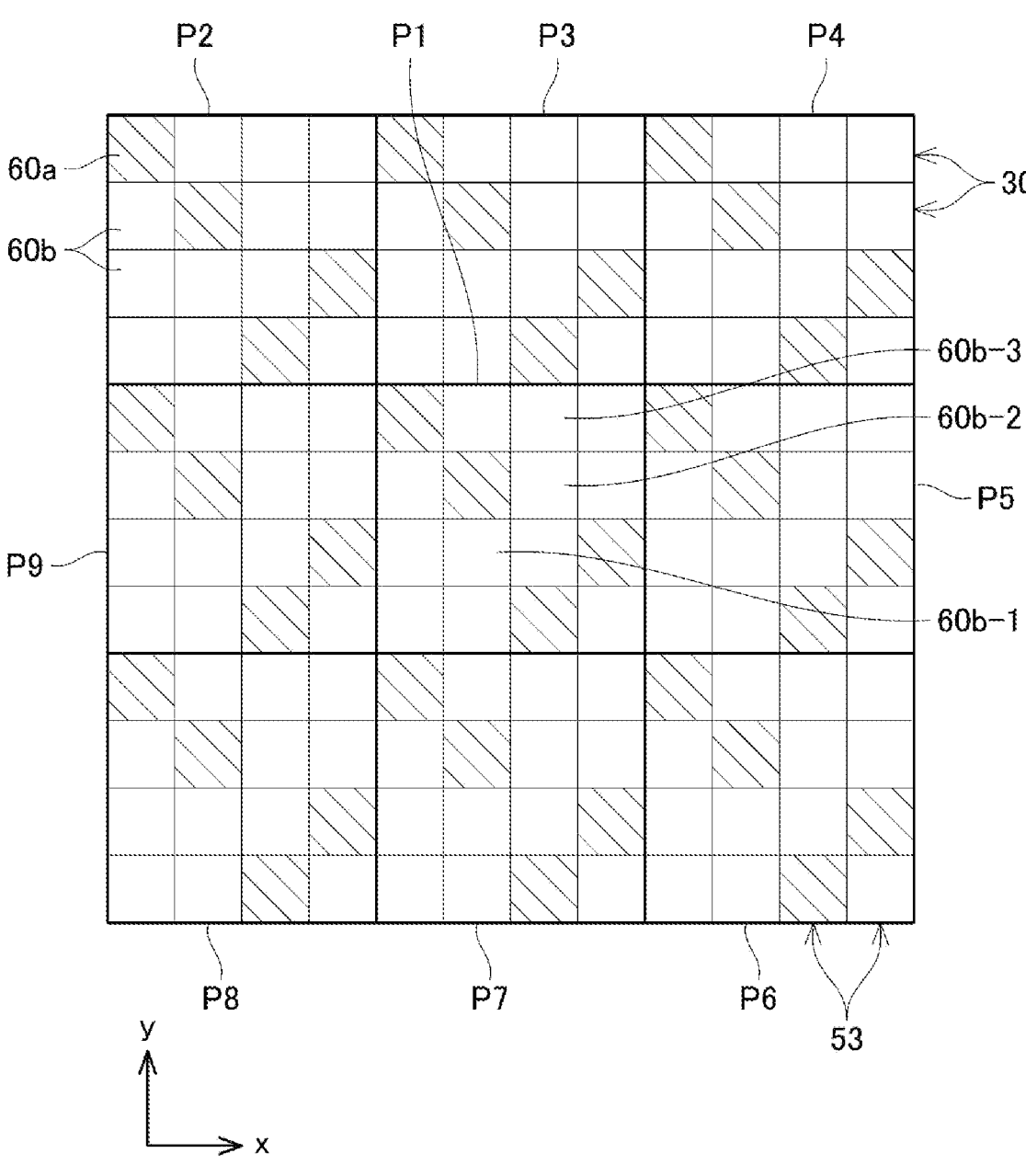
FIG. 8 is a diagram illustrating a plurality of reference patterns P arranged adjacent to each other.

A reference pattern P in FIG. 6 illustrates a pattern of arrangement of the connection intersection portions 60a and the non-connection intersection portions 60b. The connection intersection portions 60a and the non-connection intersection portions 60b are arranged such that the reference pattern P repeats in the x direction and the y direction. FIG. 7 schematically illustrates the reference pattern P. Each cell in FIG. 7 indicates the intersection portion 60. In FIG. 7, cells hatched with oblique lines are the connection intersection portions 60a, and blank cells are the non-connection intersection portions 60b. FIG. 8 illustrates a plurality of reference patterns P arranged in a matrix in the x direction and the y direction. In FIG. 8, the reference pattern P at the center is indicated by reference numeral P1, and the reference patterns P around the center are indicated by reference numerals P2 to P9. The reference pattern P is set to satisfy the following conditions 1 to 3 within a range in which the connection intersection portions 60a and the non-connection intersection portions 60b are repeatedly arranged according to the reference pattern P.

Condition 1

In each of the inter-trench semiconductor layers 30, the connection intersection portions 60a are arranged at regular intervals in the x direction, and three non-connection intersection portions 60b are arranged between two connection intersection portions 60a adjacent in the x direction. That is, as illustrated in FIG. 7 and FIG. 8, in each of the inter-trench semiconductor layers 30, the connection intersection portions 60a are arranged in the x direction at intervals such that one connection intersection portion 60a appears with respect to three non-connection intersection portions 60b.

Condition 2

In each of the rows 53, the connection intersection portions 60a are arranged at regular intervals in the y direction, and three non-connection intersection portions 60b are arranged between two connection intersection portions 60a adjacent in the y direction. That is, as illustrated in FIG. 7 and FIG. 8, in each of the rows 53, the connection intersection portions 60a are arranged at intervals in the y direction such that one connection intersection portion 60a appears with respect to three non-connection intersection portions 60b.

Condition 3

In the range in which the reference patterns P are continuous, a Manhattan distance from each of the non-connection intersection portions 60b to closest one of the connection intersection portions 60a is 1 for each of the non-connection intersection portions 60b.

Here, the Manhattan distance is a value counted with a unit of each of the intersection portions 60. For example, in FIG. 8, since a non-connection intersection portion 60b-1 is adjacent to one of the connection intersection portions 60a in the y direction, the Manhattan distance of the non-connection intersection portion 60b-1 to the closest connection intersection portion 60a is 1. In addition, since a non-connection intersection portion 60b-2 is adjacent to one of the connection intersection portions 60a in the x direction, the Manhattan distance of the non-connection intersection portion 60b-2 to the closest connection intersection portion 60a is 1. In addition, since a non-connection intersection portion 60b-3 is adjacent to one of the connection intersection portions 60a of the adjacent reference pattern P3 in the y direction, the Manhattan distance of the non-connection intersection portion 60b-3 to the closest connection intersection portion 60a is 1. In all of the non-connection intersection portions 60b in the central reference pattern P1 illustrated in FIG. 8, the Manhattan distance to the closest connection intersection portion 60a is 1. As described above, in the range in which the reference patterns P are continuous, the Manhattan distance to the closest connection intersection portion 60a is 1 in all the non-connection intersection portions 60b in the reference pattern P.

Hereinafter, the position of each cell in the reference pattern P of FIG. 7 is represented by coordinates (x, y). In FIG. 7, the leftmost column is represented as x=1, and the rightmost column is represented as x=4. In FIG. 7, the lowermost row is represented as y=1, and the uppermost row is represented as y=4. In the pattern P, the cells at the coordinates (1, 4), (2, 4), (3, 4), and (4, 3) are the connection intersection portion 60a, and the other cells are the non-connection intersection portions 60b. By following such a reference pattern P, the Manhattan distance of each of the non-connection intersection portions 60b in the range in which the reference patterns P are continuous can be set to 1.

The switching element 10 of the first embodiment is a so-called metal-oxide-semiconductor field effect transistor (MOSFET). In a normal state, a potential higher than a potential of the source electrode 22 is applied to the drain electrode 24. When a potential higher than a gate threshold is applied to the gate electrode 18, an inversion layer is formed in the body region 42, and the source region 40 and the drift region 44 are connected by the inversion layer. As a result, the switching element 10 is turned on, and a current flows from the drain electrode 24 to the source electrode 22. Since the contact regions 54 and the connection regions 52 are disposed above and below the body region 42 in the connection intersection portions 60a, almost no current flows through the connection intersection portions 60a. In the non-connection intersection portions 60b, a current flows through the inversion layer. In the switching element 10 of the first embodiment, only a part of the intersection portions 60 is the connection intersection portions 60a, and the remaining intersection portions 60 are the non-connection intersection portions 60b. Since the number of connection intersection portions 60a is small, it is possible to cause a current to flow through the semiconductor substrate 12 at high density when the switching element 10 is turned on. Therefore, the on-resistance of the switching element 10 is low.

When the potential of the gate electrode 18 is lowered to a potential lower than the gate threshold, the switching element 10 is turned off and the current stops. When the switching element 10 is turned off, a reverse voltage is applied to a pn junction at an interface between the body region 42 and the drift region 44, and a depletion layer spreads from the body region 42 to the drift region 44. Since the deep regions 50 are connected to the body region 42 by the connection regions 52, the potential of the deep regions 50 is substantially equal to the potential of the body region 42. Therefore, a reverse voltage is applied to pn junctions at interfaces between the deep regions 50 and the drift region 44, and depletion layers spread from the deep regions 50 to the drift region 44. The depletion layers extending from the deep regions 50 restrict a high electric field from being applied to the gate insulating films 16 at lower end portions of the trenches 14.

There may be a case where a potential higher than the potential of the drain electrode 24 is applied to the source electrode 22. In this case, a diode (so-called body diode) formed by the pn junction at the interface between the body region 42 and the drift region 44 is turned on, and a current flows from the source electrode 22 to the drain electrode 24. In a state where the body diode is in on-state, holes flow from the body region 42 into the drift region 44. Thus many holes are present in the drift region 44. Thereafter, when the potential of the drain electrode 24 becomes higher than the potential of the source electrode 22, the body diode is turned off. Then, holes present in the drift region 44 flow to the deep regions 50 as indicated by arrows 100 in FIG. 2. The holes flowing from the drift region 44 into the deep regions 50 flow to the source electrode 22 via the connection regions 52 and the contact regions 54. The current generated when the body diode is turned off in this manner is called a recovery current. As illustrated in FIG. 2, in the connection intersection portions 60a where the connection regions 52 are provided, the recovery current flows more easily to the drift region 44 than in the non-connection intersection portions 60b where the connection regions 52 are not provided.

In addition, there may be a case where an overvoltage is applied to the switching element 10 in a direction in which the drain electrode 24 has a higher potential than the source electrode 22. In this case, an avalanche current is generated in the drift region 44. The avalanche current flows to the deep regions 50 as indicated by the arrows 100 in FIG. 2. The avalanche current flowing from the drift region 44 into the deep regions 50 flows to the source electrode 22 via the connection regions 52 and the contact regions 54. As illustrated in FIG. 2, in the connection intersection portions 60a where the connection regions 52 are provided, the avalanche current more easily flows to the drift region 44 than in the non-connection intersection portions 60b where the connection regions 52 are not provided.

As described above, in the connection intersection portions 60a, the recovery current and the avalanche current are more likely to flow in the drift region 44 than in the non-connection intersection portions 60b. In the non-connection intersection portions 60b, the recovery current and the avalanche current are less likely to flow with increase in the distance to the connection intersection portions 60a.

Figure 9:
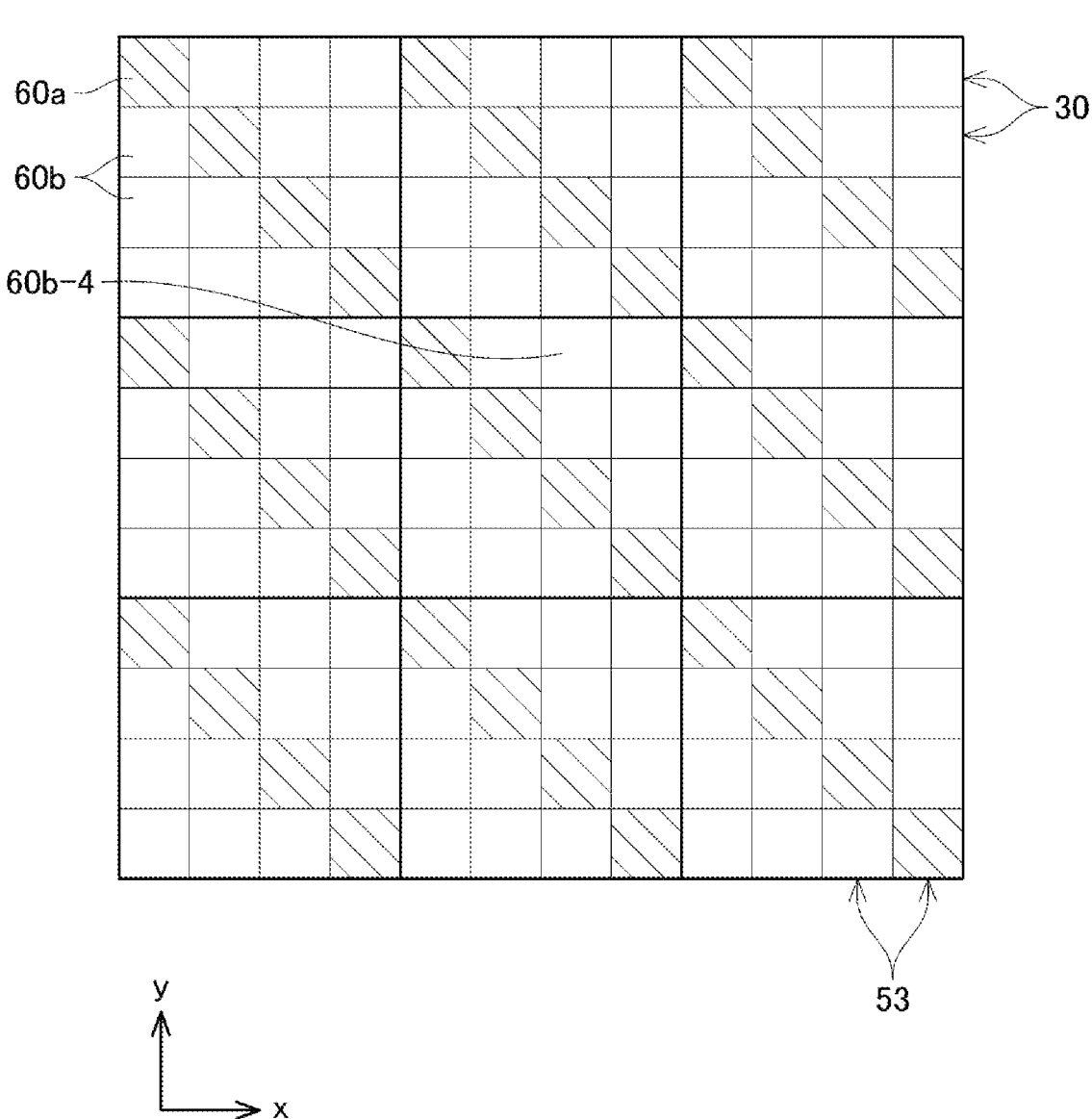
FIG. 9 is a diagram illustrating a reference pattern of a comparative example.

FIG. 9 illustrates a reference pattern of a switching element according to a comparative example. In the reference pattern illustrated in FIG. 9, a non-connection intersection portion 60b-4 is not adjacent to any connection intersection portion 60a. Therefore, a Manhattan distance from the non-connection intersection portion 60b-4 to the connection intersection portion 60a is 2. In this way, the recovery current and the avalanche current hardly flow in the non-connection intersection portion 60b-4 where the Manhattan distance to the connection intersection portion 60a is long. Therefore, in the reference pattern of FIG. 9, the concentration of the avalanche current is likely to occur at the connection intersection portions 60a. Therefore, in the switching element of the comparative example, an avalanche resistance may decrease. On the other hand, in the switching element 10 of the first embodiment, the Manhattan distance to the closest connection intersection portion 60a is 1 in all the non-connection intersection portions 60b in the range in which the reference patterns P are continuous. Therefore, in the switching element 10 of the first embodiment, concentration of the avalanche current is less likely to occur at the connection intersection portions 60a. Therefore, in the switching element 10 according to the first embodiment, the stress applied to the semiconductor substrate 12 when the avalanche current flows can be reduced. Therefore, according to the structure of the switching element 10 of the first embodiment, it is possible to realize higher reliability.

Figure 10:
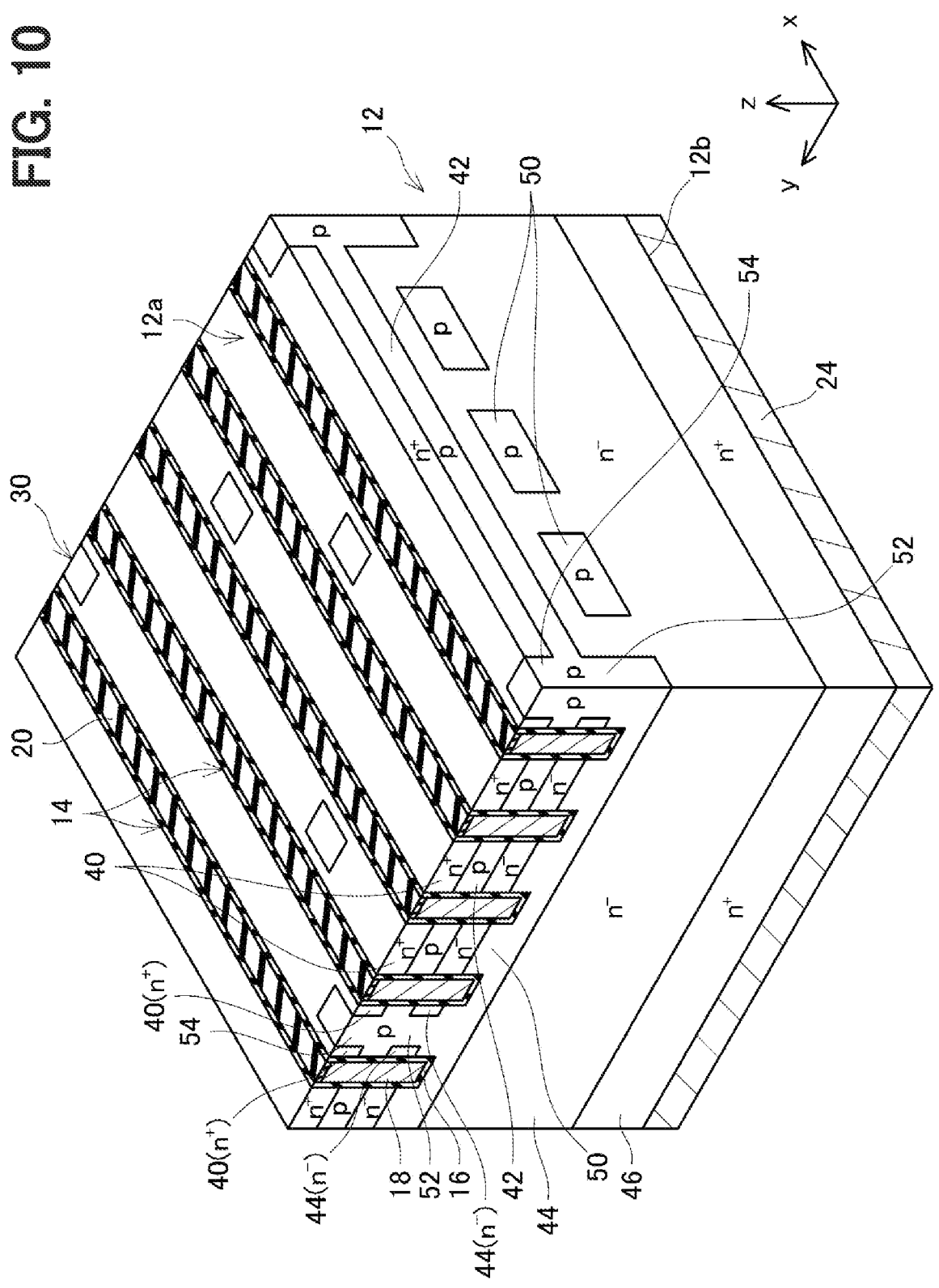
FIG. 10 is a perspective view including cross sections along an x direction and a y direction of a switching element according to a first modification.

As illustrated in FIG. 10, gaps may be provided between the connection regions 52 and the gate insulating films 16, and the drift region 44 may be disposed in the gaps. In addition, as illustrated in FIG. 10, gaps may be provided between the contact regions 54 and the gate insulating films 16, and the source region 40 may be disposed in the gaps. According to this configuration, when the switching element is turned on, a current also flows through the connection intersection portions 60a. Therefore, the on-resistance of the switching element can be further reduced.

Second Embodiment

Figure 11:
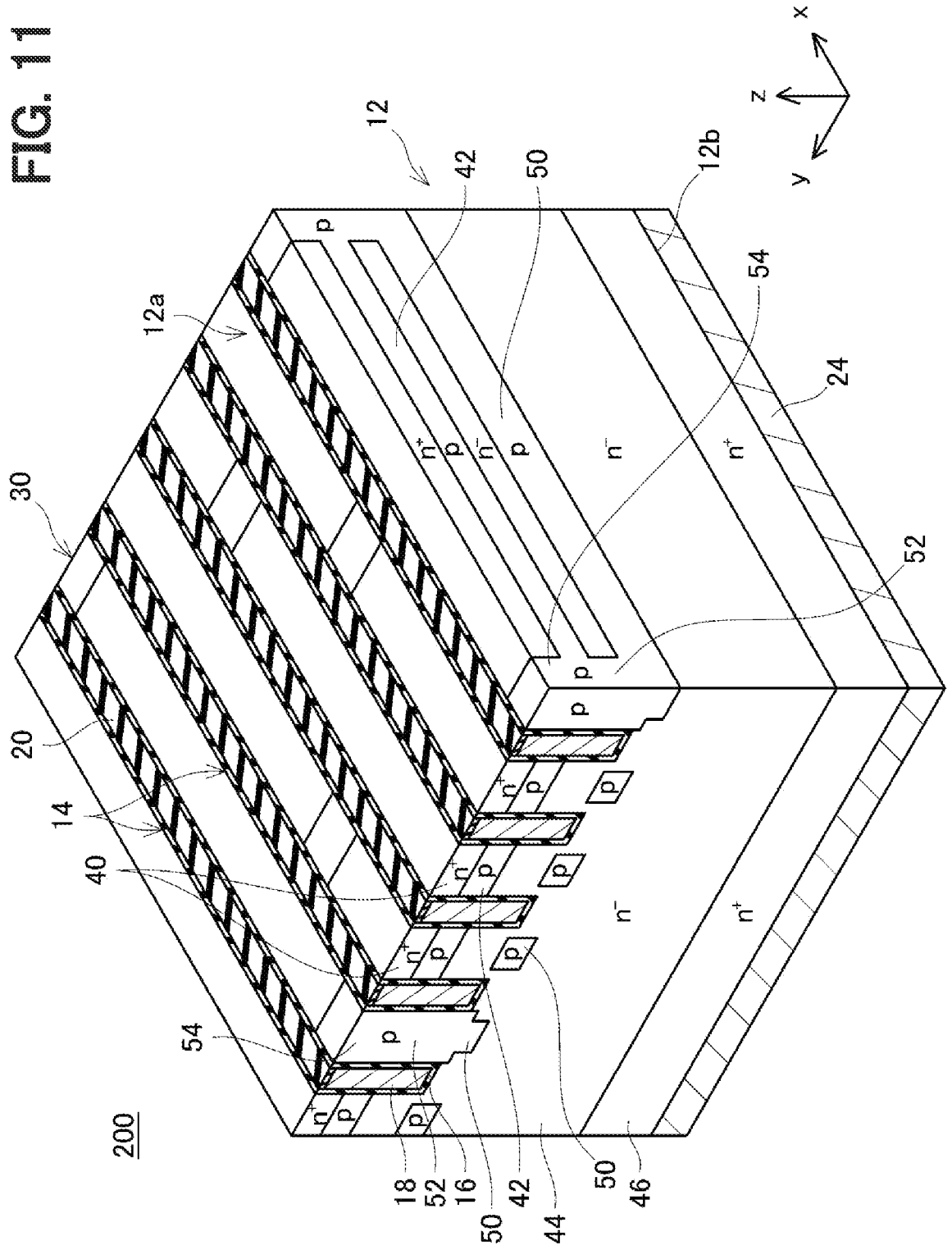
FIG. 11 is a perspective view including cross sections along an x direction and a y direction of a switching element according to a second embodiment.
Figure 12:
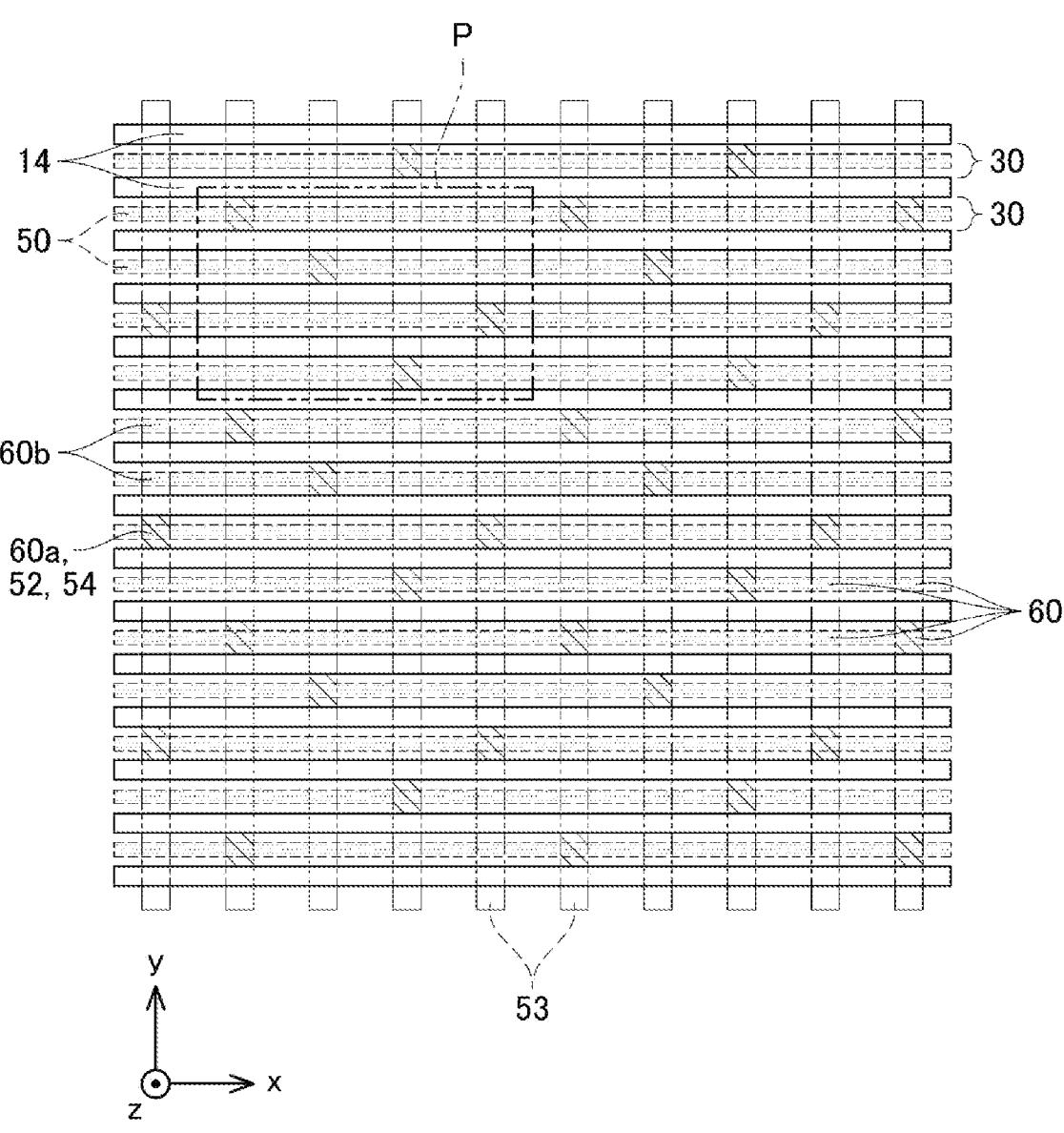
FIG. 12 is a plan view illustrating an arrangement of connection intersection portions and non-connection intersection portions of the switching element according to the second embodiment.

FIG. 11 and FIG. 12 illustrate a switching element 200 according to a second embodiment. In the second embodiment, each of the deep regions 50 extends linearly in the x direction. The deep regions 50 are arranged at intervals in the y direction. The deep regions 50 are disposed below central portions of the respective inter-trench semiconductor layers 30 in the y direction.

Each of the deep regions 50 is connected to the source electrode 22 via the connection regions 52 and the contact regions 54. As illustrated in FIG. 12, the connection regions 52 are arranged to form rows 53 extending linearly in the y direction. The rows 53 are arranged at intervals in the x direction.

As illustrated in FIG. 12, the sets of the connection region 52 and the contact region 54 are provided in a part of the intersection portions 60. As in the first embodiment, the connection intersection portions 60a and the non-connection intersection portions 60b are arranged according to the same reference pattern P as in FIG. 7 and FIG. 8. That is, the connection intersection portions 60a and the non-connection intersection portions 60b are arranged so as to satisfy the conditions 1 to 3 described above. Therefore, also in the second embodiment, there is no non-connection intersection portion 60b in which the Manhattan distance to the closest connection intersection portion 60a is 2 or more in the range in which the reference patterns P are continuous. Therefore, also in the switching element 200 according to the second embodiment, the concentration of the recovery current and the avalanche current is unlikely to occur at the connection intersection portions 60$a$. According to the structure of the switching element 200 of the second embodiment, high reliability can be realized.

In the second embodiment, similarly to FIG. 10, the drift region 44 may be disposed between the connection regions 52 and the gate insulating films 16. In addition, similarly to FIG. 10, the source region 40 may be provided between the contact regions 54 and the gate insulating films 16.

Third Embodiment

Figure 13:
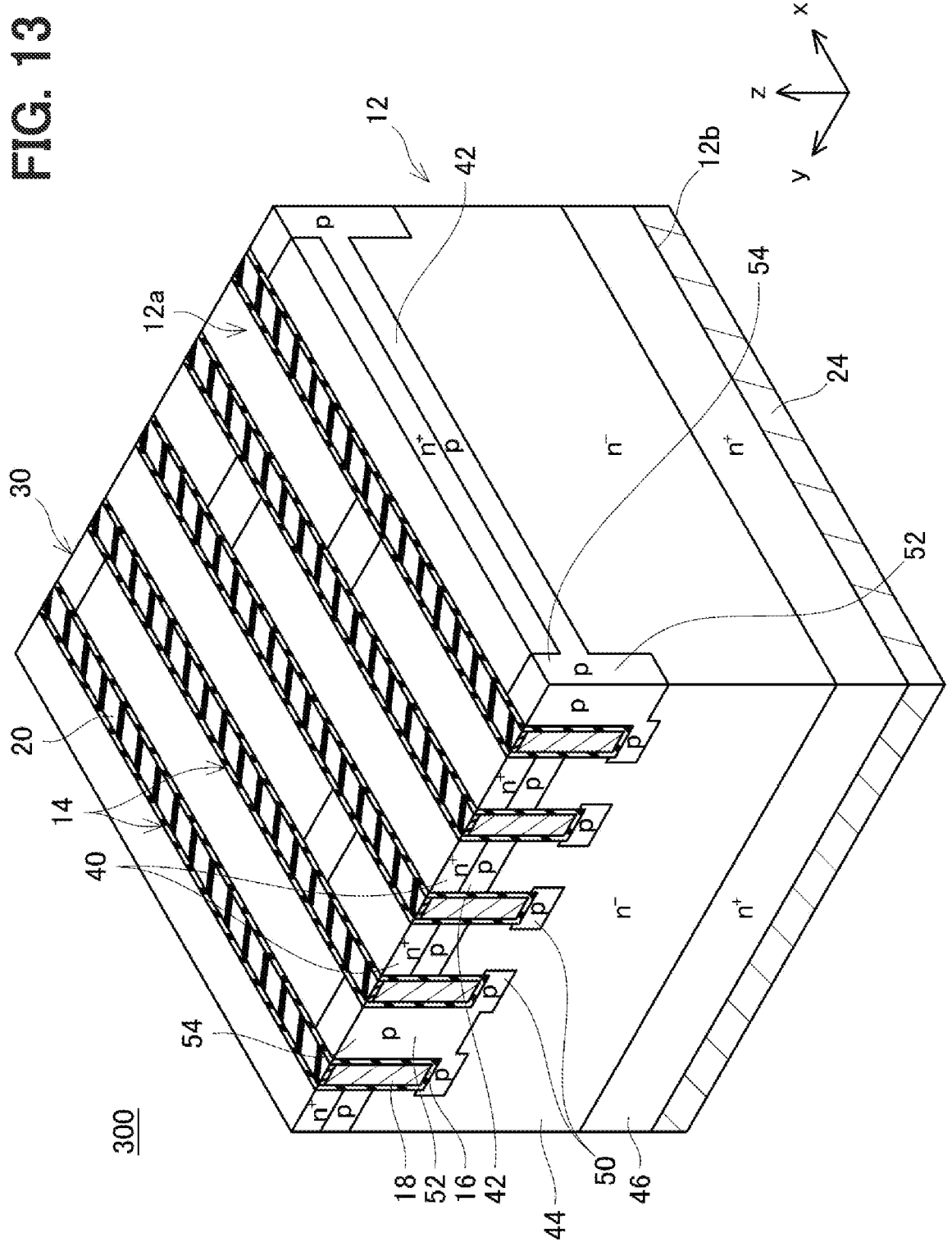
FIG. 13 is a perspective view including cross sections along an x direction and a y direction of a switching element according to a third embodiment.
Figure 14:
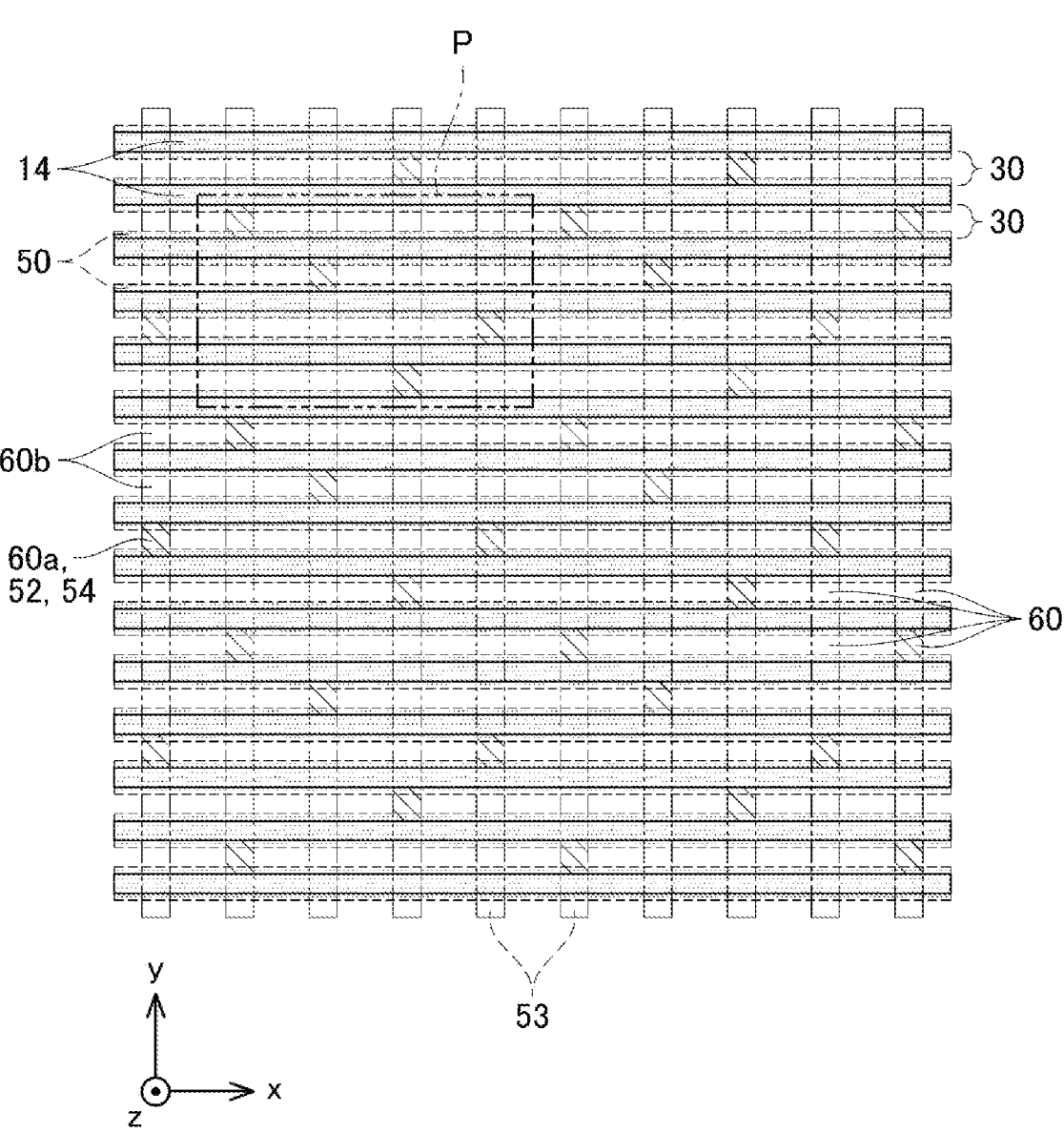
FIG. 14 is a plan view illustrating an arrangement of connection intersection portions and non-connection intersection portions of the switching element according to the third embodiment.

FIG. 13 and FIG. 14 illustrate a switching element 300 according to a third embodiment. In the third embodiment, each of the deep regions 50 extends linearly in the x direction. The deep regions 50 are arranged at intervals in the y direction. The deep regions 50 are disposed below the respective trenches 14.

Each of the deep regions 50 is connected to the source electrode 22 via the connection regions 52 and the contact regions 54. As illustrated in FIG. 14, the connection regions 52 are arranged to form rows 53 extending linearly in the y direction. The rows 53 are arranged at intervals in the x direction.

As illustrated in FIG. 14, the sets of the connection region 52 and the contact region 54 are provided in a part of the intersection portions 60. As in the first embodiment, the connection intersection portions 60$a$ and the non-connection intersection portions 60$b$ are arranged according to the same reference pattern P as in FIG. 7 and FIG. 8. That is, the connection intersection portions 60$a$ and the non-connection intersection portions 60$b$ are arranged so as to satisfy the conditions 1 to 3 described above. Therefore, also in the third embodiment, there is no non-connection intersection portion 60$b$ in which the Manhattan distance to the closest connection intersection portion 60$a$ is 2 or more in the range in which the reference patterns P are continuous. Therefore, also in the switching element 300 according to the third embodiment, the concentration of the recovery current and the avalanche current is unlikely to occur at the connection intersection portions 60$a$. According to the structure of the switching element 300 of the third embodiment, high reliability can be realized.

Fourth Embodiment

Figure 15:
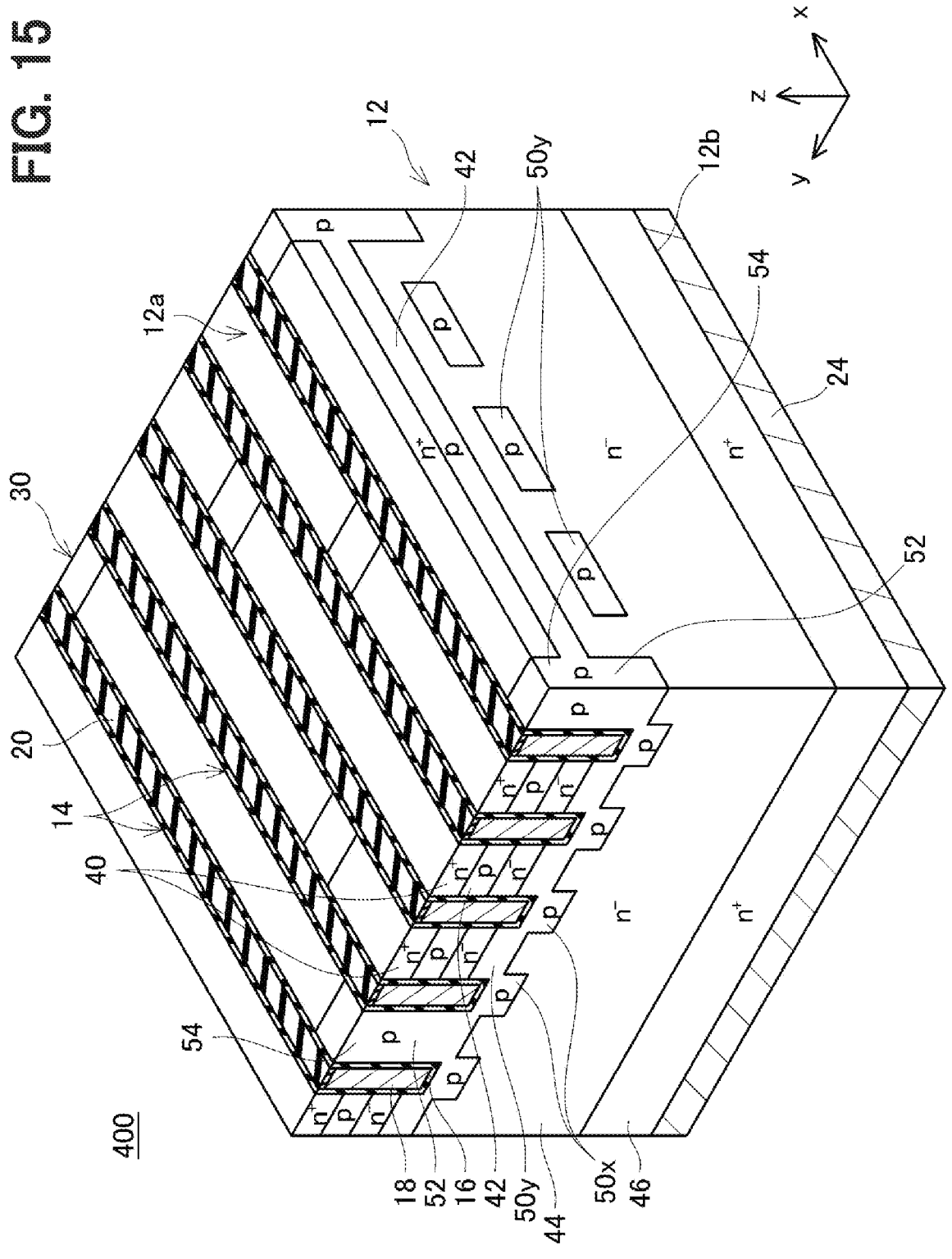
FIG. 15 is a perspective view including cross sections along an x direction and a y direction of a switching element according to a fourth embodiment.
Figure 16:
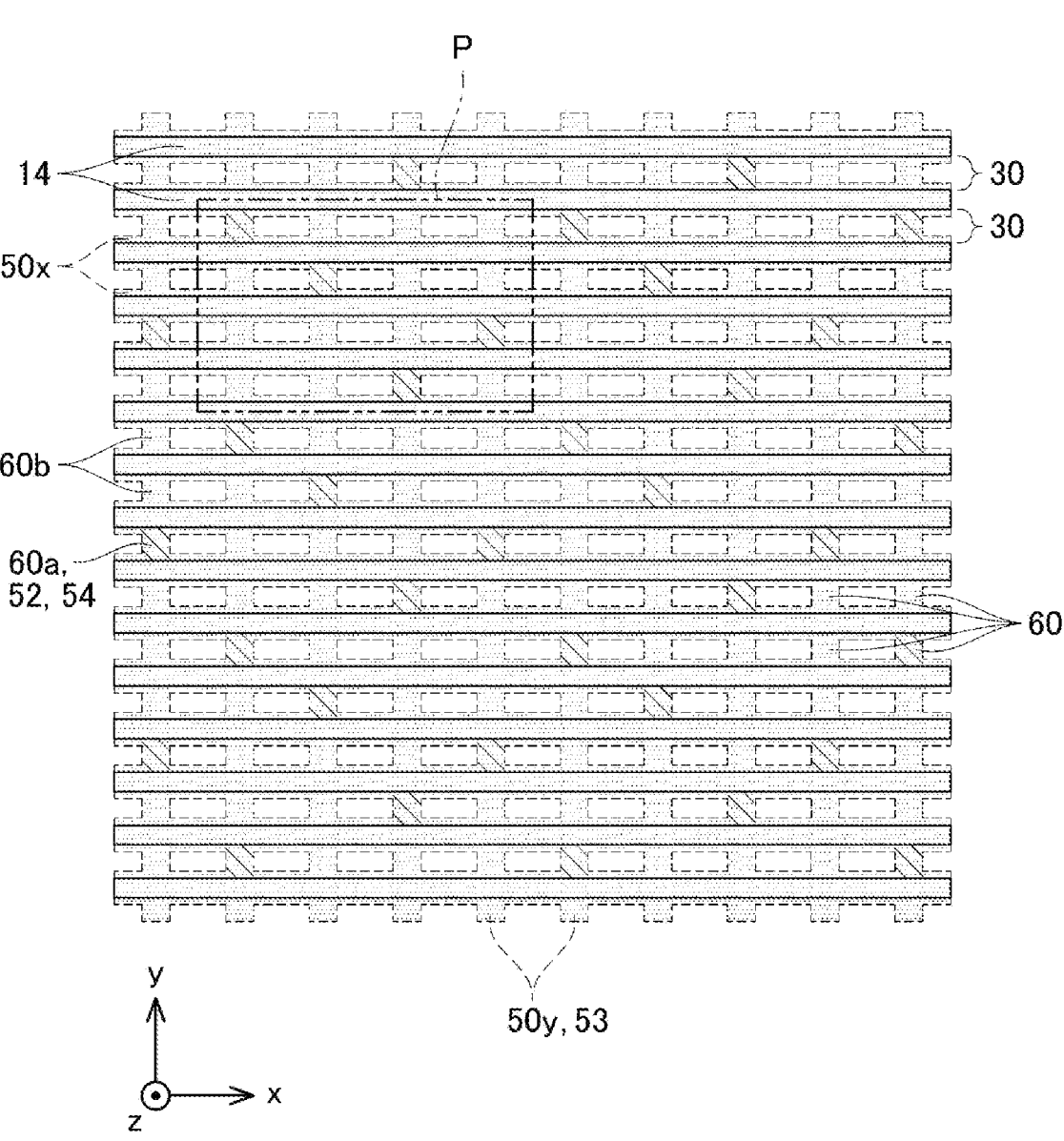
FIG. 16 is a plan view illustrating an arrangement of connection intersection portions and non-connection intersection portions of the switching element according to the fourth embodiment.

FIG. 15 and FIG. 16 illustrate a switching element 400 according to a fourth embodiment. The switching element 400 of the fourth embodiment has two types of deep regions 50$x$ and 50$y$. Each of the deep regions 50$y$ extends linearly in the y direction. The deep regions 50$y$ are arranged at intervals in the x direction. Each of the deep regions 50$y$ is disposed at a depth including the lower ends of the trenches 14. Each of the deep regions 50$x$ is disposed below each of the deep regions 50$y$. Each of the deep regions 50$x$ extends linearly in the x direction. The deep regions 50$x$ are arranged at intervals in the y direction. An upper end portion of each of the deep regions 50$x$ is disposed at a depth overlapping a lower end portion of each of the deep regions 50$y$. Each of the deep regions 50$x$ and each of the deep regions 50$y$ are connected to each other at a point where they intersect with each other.

Each of the deep regions 50$y$ is connected to the source electrode 22 via the connection regions 52 and the contact regions 54. As illustrated in FIG. 16, the connection regions 52 are arranged to form rows 53 extending linearly in the y direction. In FIG. 16, the rows 53 extending in the y direction overlap the deep regions 50$y$. The rows 53 are arranged at intervals in the x direction.

As illustrated in FIG. 16, the sets of the connection region 52 and the contact region 54 are provided in a part of the intersection portions 60. As in the first embodiment, the connection intersection portions 60$a$ and the non-connection intersection portions 60$b$ are arranged according to the same reference pattern P as in FIG. 7 and FIG. 8. That is, the connection intersection portions 60$a$ and the non-connection intersection portions 60$b$ are arranged so as to satisfy the conditions 1 to 3 described above. Therefore, also in the fourth embodiment, there is no non-connection intersection portion 60$b$ in which the Manhattan distance to the closest connection intersection portion 60$a$ is 2 or more in the range in which the reference patterns P are continuous. Therefore, also in the switching element 400 according to the fourth embodiment, the concentration of the recovery current and the avalanche current is unlikely to occur at the connection intersection portions 60$a$. According to the structure of the switching element 400 of the fourth embodiment, high reliability can be realized.

In addition, in the fourth embodiment, the deep regions 50$x$ and 50$y$ extend along the x direction and the y direction, respectively. Accordingly, the deep regions 50$x$, 50$y$ in each of the non-connection intersection portions 60$b$ are connected to the connection regions 52 by a current path having a Manhattan distance in a range of 1. As described above, since the deep regions 50$x$ and 50$y$ in each of the non-connection intersection portions 60$b$ are connected to the connection region 52 by short current paths, the potentials of the deep regions 50$x$ and 50$y$ can be stabilized.

In the above-described fourth embodiment, the deep regions 50$y$ are disposed above the deep regions 50$x$. However, the deep regions 50$x$ may be disposed above the deep regions 50$y$. Alternatively, the deep region 50$x$ and the deep region 50$y$ may be arranged at the same depth.

Other Embodiments

Figure 17:
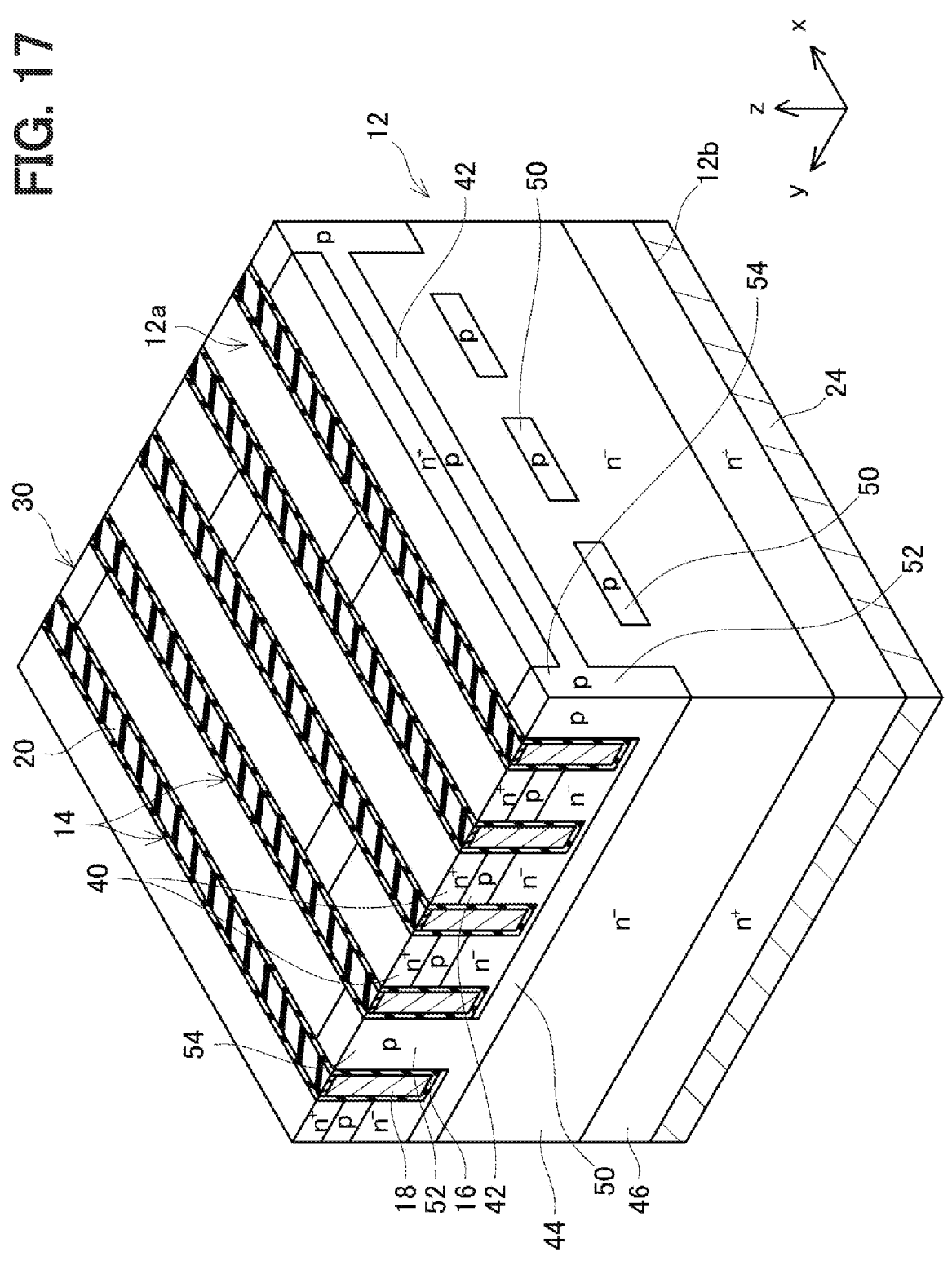
FIG. 17 is a perspective view including cross sections along an x direction and a y direction of a switching element according to a second modification.

In the first to fourth embodiments described above, each of the deep regions 50 is disposed at a depth including the lower ends of the trenches 14. Alternatively, each of the deep regions 50 may be disposed below the lower ends of the trenches 14. For example, in the first embodiment, each of the deep regions 50 may be disposed below the lower ends of the trenches 14 as illustrated in FIG. 17.

In the first to fourth embodiments described above, the contact regions 54 are disposed above the connection regions 52. However, the positions of the connection regions 52 and the contact regions 54 may be shifted in the x direction. The number of connection regions 52 and the number of contact regions 54 may be different from each other.

In the first to fourth embodiments described above, the connection intersection portions 60$a$ and the non-connection intersection portions 60$b$ are arranged in accordance with the reference pattern P illustrated in FIG. 7 and FIG. 8. However, the connection intersection portions 60$a$ and the non-connection intersection portions 60$b$ may be arranged in any manner as long as the reference pattern satisfies the conditions 1 to 3. For example, a reference pattern obtained by shifting the reference pattern P illustrated in FIG. 7 and FIG. 8 in the x direction and the y direction may be adopted, a reference pattern obtained by rotating the reference pattern P rightward or leftward by 90 degrees or 180 degrees may be adopted, or a reference pattern obtained by inverting the reference pattern P upward and downward or leftward and rightward may be adopted.

Figure 18:
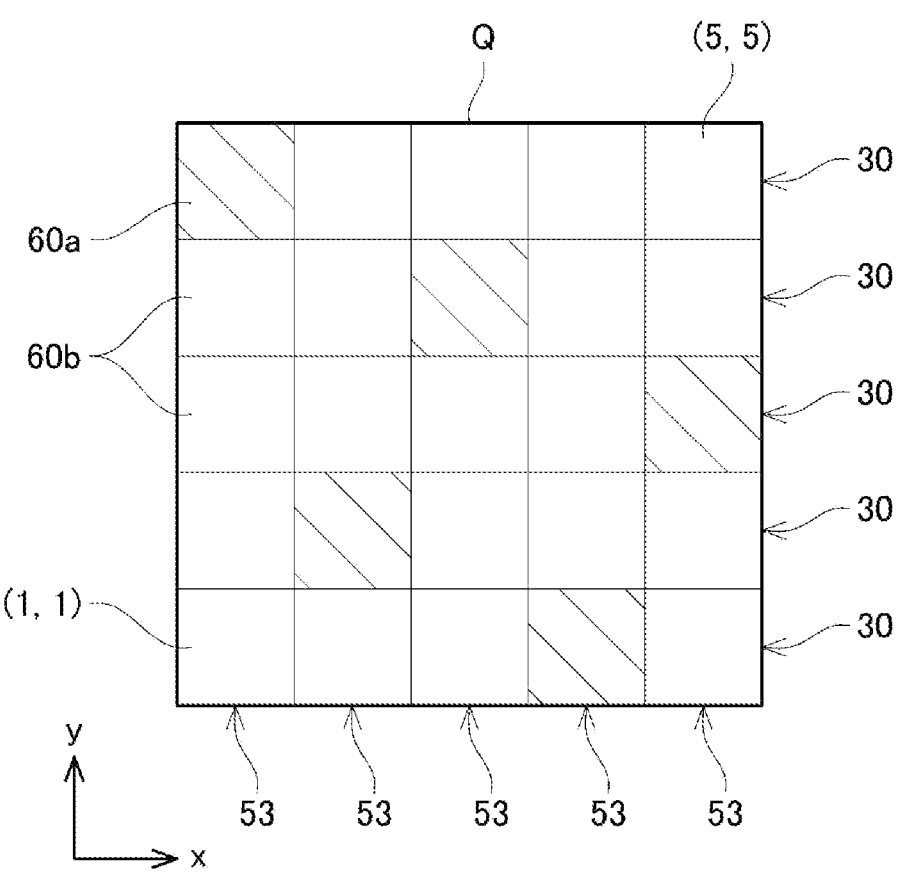
FIG. 18 is a diagram illustrating a reference pattern Q in a case where a reference number is four.
Figure 19:
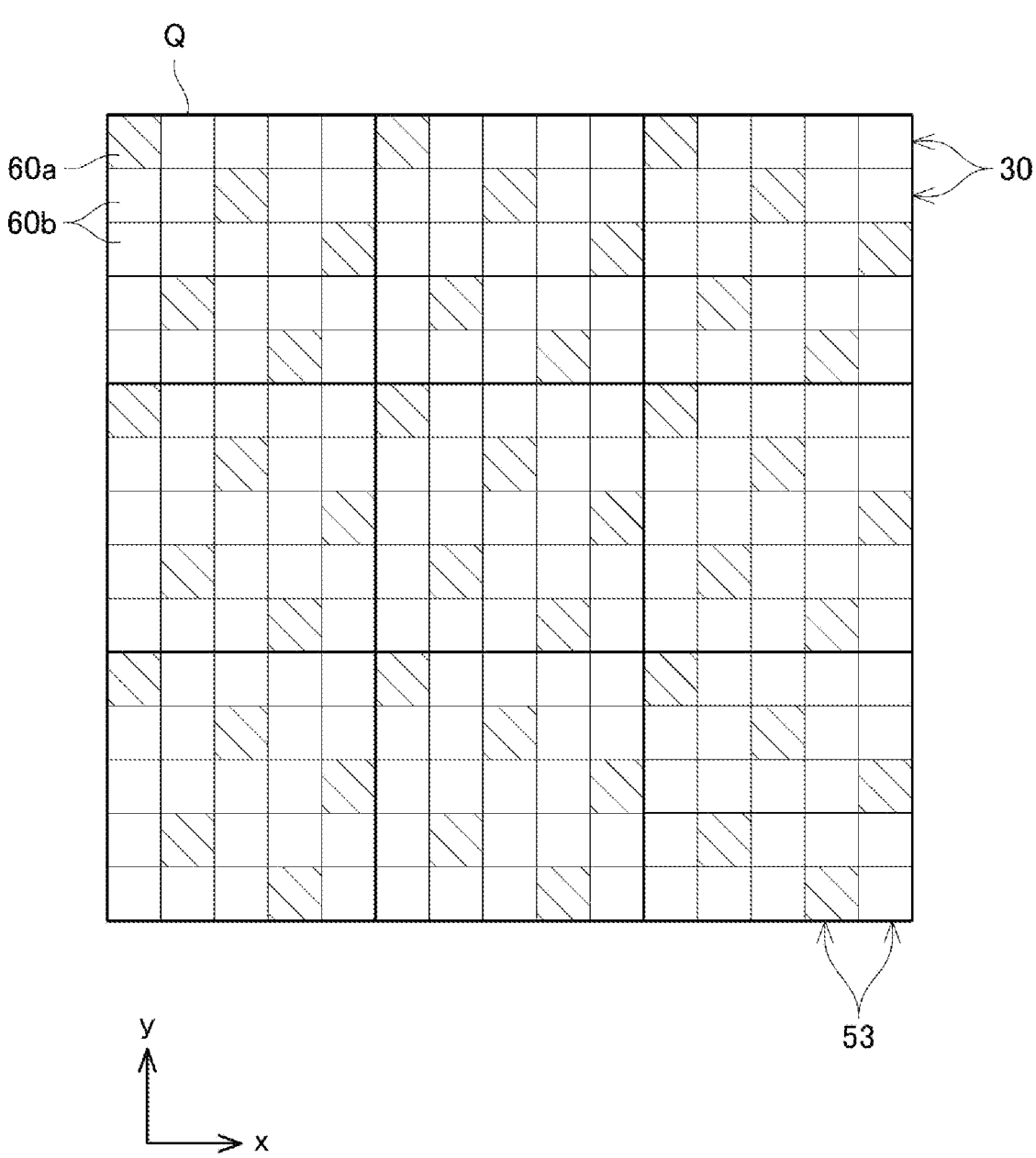
FIG. 19 is a diagram illustrating a plurality of reference patterns Q arranged adjacent to each other.

In the first to fourth embodiments described above, three non-connection intersection portions 60b are arranged at intervals between two connection intersection portions 60a in the x direction and the y direction. That is, the number of the non-connection intersection portions 60b arranged within the interval (that is, a reference number) is three. However, the reference number may be four. In other words, four non-connection intersection portions 60b may be arranged at intervals between two connection intersection portions 60a in the x direction and the y direction. In this case, the connection intersection portions 60a and the non-connection intersection portions 60b may be arranged in accordance with a reference pattern Q illustrated in FIG. 18 and FIG. 19. In the reference pattern Q, cells at the coordinates (1, 5), (2, 2), (3, 4), (4, 1), and (5, 3) are the connection intersection portions 60a, and the other cells are the non-connection intersection portions 60b. In a range in which the reference patterns Q are continuous, the Manhattan distance to the closest connection intersection portion 60a is 1 in all the non-connection intersection portions 60b in the reference patterns Q. Alternatively, a reference pattern obtained by shifting the reference pattern Q in the x direction and the y direction may be adopted, a reference pattern obtained by rotating the reference pattern Q to the right or left by 90 degrees or 180 degrees may be adopted, or a reference pattern obtained by inverting the reference pattern Q vertically or horizontally may be adopted.

Although the embodiments have been described in detail above, these are merely examples and do not limit the scope of claims. The techniques described in the claims include various modifications and modifications of the specific examples illustrated above. The technical elements described in the present specification or the drawings exhibit technical usefulness alone or in various combinations, and are not limited to the combinations described in the claims at the time of filing. In addition, the techniques illustrated in the present specification or drawings achieve a plurality of objectives at the same time, and achieving one of the objectives itself has technical usefulness.

What is claimed is:

1. A switching element comprising:
a semiconductor substrate having a plurality of trenches provided from an upper surface of the semiconductor substrate, each of the plurality of trenches extending linearly in a first direction on the upper surface of the semiconductor substrate, the plurality of trenches being arranged at an interval in a second direction that intersects the first direction on the upper surface of the semiconductor substrate;
a gate insulating film covering an inner surface of each of the plurality of trenches;
a gate electrode disposed inside each of the plurality of trenches and being insulated from the semiconductor substrate by the gate insulating film; and
a source electrode being in contact with the upper surface of the semiconductor substrate, wherein
the semiconductor substrate includes a plurality of inter-trench semiconductor layers, and each of inter-trench semiconductor layers is interposed between adjacent two of the plurality of trenches,
each of the plurality of inter-trench semiconductor layers includes a source region of n-type being in contact with the gate insulating film and the source electrode, and a body region of p-type being in contact with the gate insulating film at a position below the source region,
the semiconductor substrate further includes:
a drift region of n-type disposed over a lower portion of the plurality of inter-trench semiconductor layers and being in contact with the gate insulating film at a position below the body region in each of the plurality of inter-trench semiconductor layers;
a plurality of deep regions of p-type disposed in a range surrounded by the drift region, disposed below the body region at an interval from the body region, and disposed in a range including a lower end of each of the plurality of trenches or below the lower end of each of the plurality of trenches in a thickness direction of the semiconductor substrate; and
a plurality of connection regions of p-type connecting the body region and the plurality of deep regions;
when the semiconductor substrate is viewed from above, the plurality of connection regions is arranged at an interval along the second direction to form a plurality of rows that extends linearly in the second direction, and the plurality of rows is arranged at an interval in the first direction,
when the semiconductor substrate is viewed from above, the plurality of inter-trench semiconductor layers intersects the plurality of rows at a plurality of intersection portions, and the plurality of intersection portions includes a plurality of connection intersection portions at which the plurality of connection regions is disposed and a plurality of non-connection intersection portions at which the plurality of connection regions is not disposed,
connection intersection portions included in the plurality of connection intersection portions and non-connection intersection portions included in the plurality of non-connection intersection portions are repeatedly arranged in the first direction and the second direction according to a reference pattern,
within a range in which the connection intersection portions and the non-connection intersection portions are repeatedly arranged according to the reference pattern, the connection intersection portions and the non-connection intersection portions satisfy following conditions (i) to (iv):
(i) in each of the plurality of inter-trench semiconductor layers, the connection intersection portions are arranged in the first direction in a state where a number of the non-connection intersection portions interposed between adjacent two of the connection intersection portions is a reference number;
(ii) in each of the plurality of rows, the connection intersection portions are arranged in the second direction in a state where a number of the non-connection intersection portions interposed between adjacent two of the connection intersection portions is the reference number;
(iii) the reference number is three or four; and
(iv) a Manhattan distance is a value counted with a unit of each of the intersection portions, and the Manhattan distance of each of the non-connection intersection portions to closest one of the connection intersection portions is 1.

2. The switching element according to claim 1, wherein when the semiconductor substrate is viewed from above, the plurality of deep regions extends linearly along the second direction and is arranged at an interval in the first direction so that the plurality of deep regions extends along the plurality of rows, respectively.

3. The switching element according to claim 1, wherein each of the plurality of connection regions is in contact with the gate insulating film on side surfaces of two trenches that are included in the plurality of trenches and are located on both sides of each of the plurality of connection regions.

4. The switching element according to claim 1, further comprising a contact region of p-type disposed above each of the plurality of connection regions and connecting the body region and the source electrode.

* * * * *